United States Patent
Ecker

[19]

[11] Patent Number: 5,999,086
[45] Date of Patent: Dec. 7, 1999

[54] CIRCUIT ARRANGEMENT WITH COMBINATORIAL BLOCKS ARRANGED BETWEEN REGISTERS

[75] Inventor: Wolfgang Ecker, Munich, Germany

[73] Assignee: Siemens Aktiengesellschaft, Munich, Germany

[21] Appl. No.: 08/937,992

[22] Filed: Sep. 26, 1997

[30] Foreign Application Priority Data

Sep. 27, 1996 [DE] Germany .......................... 196 39 937

[51] Int. Cl.$^6$ ...................................................... G05B 1/00
[52] U.S. Cl. .......................... 340/146.2; 327/154; 326/93
[58] Field of Search .......................... 340/146.2; 327/154; 326/93

[56] References Cited

FOREIGN PATENT DOCUMENTS 0 456 399  11/1991  European Pat. Off. .
36 06 406   8/1986  Germany .

Primary Examiner—Margaret R. Wambach
Attorney, Agent, or Firm—Hill & Simpson

[57] ABSTRACT

Combinatorial blocks (KBL) are arranged between an input register (RG1) and output register (RG2) in the circuit arrangement. The input (E_RG1) and the output (A_RG1) of the input register (RG1) connected preceding the combinatorial blocks (KBL) is connected to a comparison unit (COM) that compares the value at the input and at the output of the input register (RG1) and, given occurrence of a signal value change at the input, outputs a control signal for loading the output value of the combinatorial blocks (KBL) into the output register (RG2) connected following the combinatorial blocks. In this way, the running time required for an operation in the circuit arrangement can be shortened given specific value combinations.

5 Claims, 4 Drawing Sheets

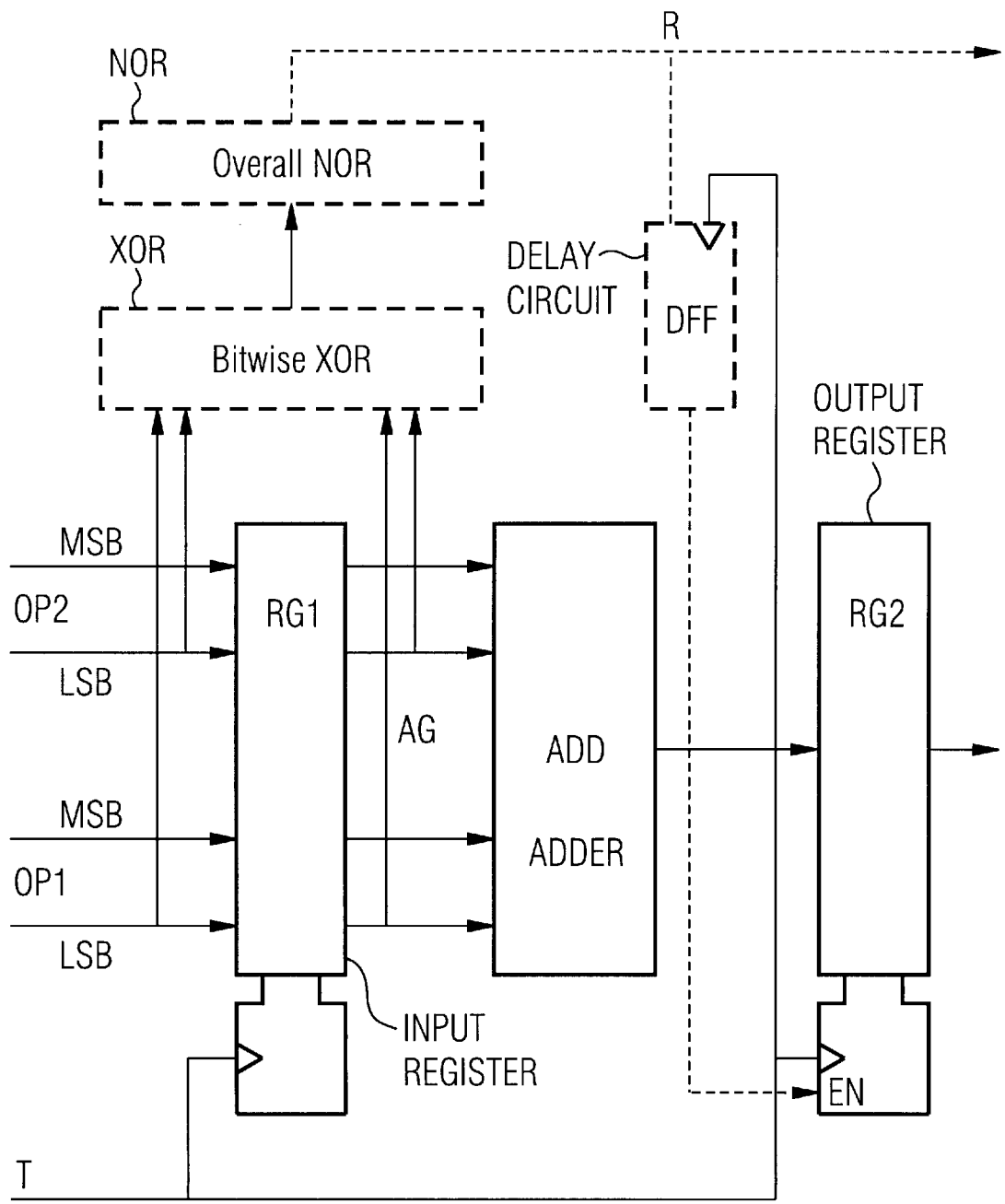

CIRCUIT ARRANGEMENT WITH COMBINATORIAL BLOCKS ARRANGED BETWEEN REGISTERS

BACKGROUND OF THE INVENTION

1. Field of the Invention

The present invention relates generally to an electrical circuit arrangement for data transfer between registers.

2. Description of the Related Art

In the development of synchronous circuits, what are referred to as combinatorial blocks KBL (also called combinatorial circuits, see FIGS. 1 and 2) always lie between registers (called, for example, an input register RG1 and an output register RG2 below). In order to adhere to the physically conditioned setup and hold times, there are currently three principles for arranging combinatorial blocks and registers:

- The running time/delay time KBL-VZ of changes in the signal value by the combinatorial blocks KBL is smaller than the clock period minus the setup time setup/hold-VZ and minus the signal running time RG-VA through a register RG. This is shown in FIG. 1. A combinatorial block KBL is connected between an input register RG1 and output register RG2. The registers RG1 and RG2 are driven with a clock signal T.
- The running time of value changes through the combinatorial blocks KBL is greater by a factor N than a clock period of the clock signal T. However, the result is only taken N clock signals later at the output of the output register RG2 after the combinatorial blocks KBL.
- The running time of value changes through the combinatorial blocks KBL is greater by a factor N than a clock period of the clock signal T. However, the result is only written into the output register RG2 following the combinatorial blocks KBL N clock signals later. To that end, an enable terminal EN at the output register RG2 is driven with a pulse that is delayed by N clock signals and is generated by a control circuit CON. This may be seen in FIG. 2.

The running time of a combinatorial circuit KBL is designed to the effect that the last possible signal value changes at their outputs always determine the running time. It is thereby assumed that these instances also always occur during operation.

When, however, certain input signals of a combinatorial circuit do not change, then their effect on the running time need not be taken into consideration. When the input signals are input signals that determine the running time of a combinatorial circuit, then the running time through the combinatorial circuit is shortened in this case.

German Letters Patent DE 36 06 406 C2 discloses a circuit arrangement with combinatorial blocks wherein the output signals thereof are output at output registers connected following the combinatorial blocks.

Further, European Patent Application EP 04 56 399 A2 discloses a circuit with combinatorial blocks and memory units.

SUMMARY OF THE INVENTION

An object underlying the present invention is comprised in utilized the aforementioned effect and tapping event-dependent values at the output of a combinatorial circuit.

This object is achieved by a circuit arrangement with combinatorial blocks (KBL) arranged between registers (RG), whereby the input (E_RG1) and the output (A_RG1) of the input register (RG1) connected preceding the combinatorial blocks (KBL) is connected to a comparison unit (COM) that compares the value at the input and at the output of the input register (RG1) and, given an occurrence of a signal value change at the input, outputs a control signal for loading the output value of the combinatorial blocks (KBL) into the output register (RG2) connected following the combinatorial blocks.

Developments of the invention derive from a circuit arrangement as described above whereby a control circuit (CON1) is provided that, given equality of the value at the input and at the output of the input register (RG1), generates a transfer signal (R) for the enable input of the output register (RG2) from the control signal, so that this takes over the value of the output of the combinatorial blocks (KBL) with the next clock signal (T).

The combinatorial blocks (KBL) are implemented as adders (ADD); whereby the less significant bytes (LSB) of the operands (OP1, OP2) supplied to the input register and the less significant bytes of the stored operands output at the output of the input register (RG1) are compared in the comparison unit (COM) and the control signal is generated given equality.

The comparison unit is an XOR circuit in a preferred embodiment.

The control circuit (CON1) of the preferred embodiment is an NOR circuit.

BRIEF DESCRIPTION OF THE DRAWINGS

FIG. 4 is a block circuit diagram of a preferred embodiment of the combinatorial circuit of the present invention.

DETAILED DESCRIPTION OF THE PREFERRED EMBODIMENTS

The invention is explained in greater detail with reference to FIG. 3 and FIG. 4.

What is referred to below as a register is always a clocked memory element, regardless of whether it is an embodiment that can store only one bit (this is also referred to as flip-flop) or can store a plurality of bits. Here, a register also refers not only to a memory element that can accept an input value but that can also additionally or alternatively set a value, reset a value (this is referred to as JK flip-flop) or conditionally store it (this is referred to as flip-flop/register with enable). Further, a register can also have an additional asynchronous set or reset input.

Figure 1:
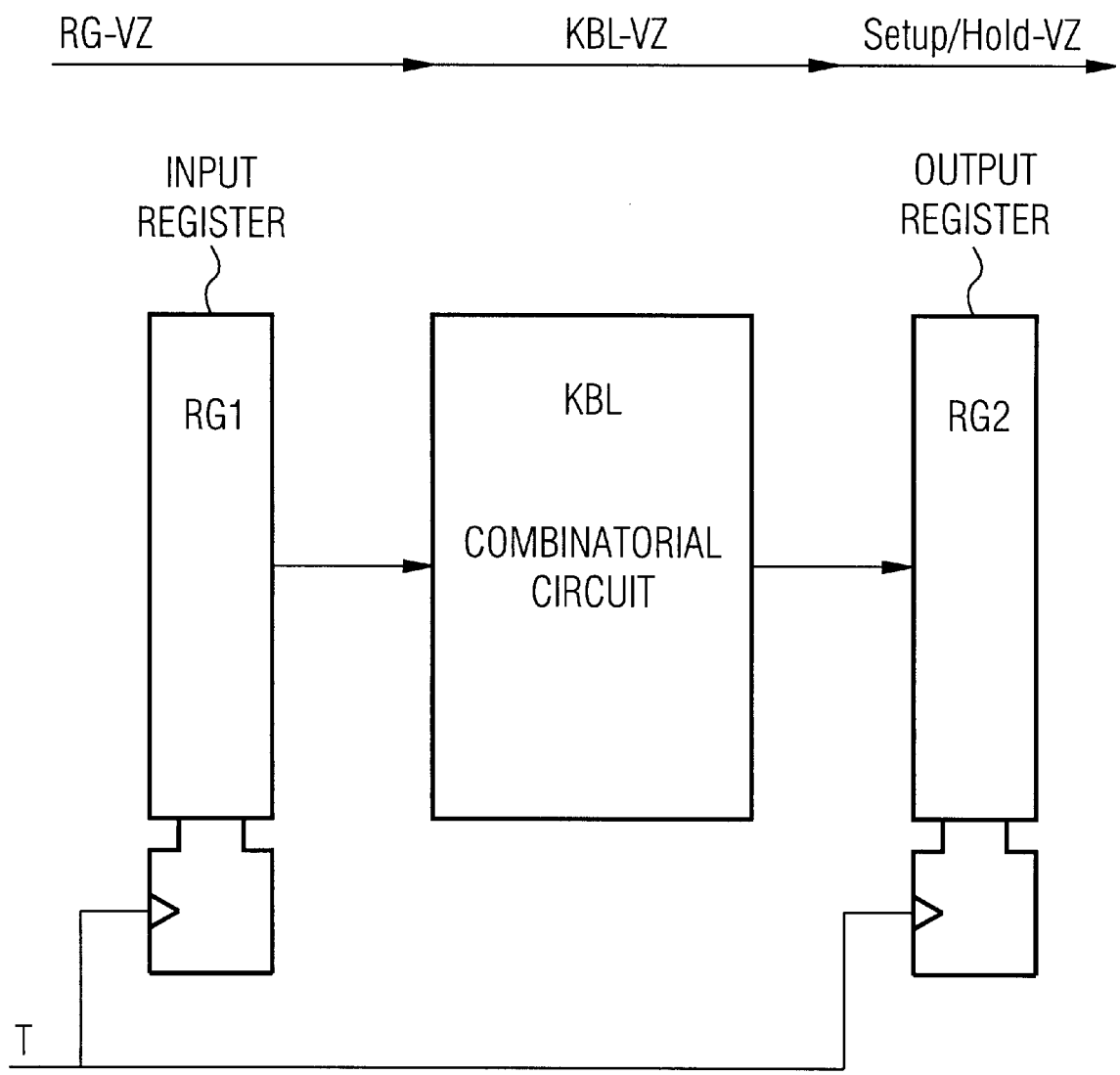
FIG. 1 is a block circuit diagram of a known combinatorial circuit between registers.
Figure 2:
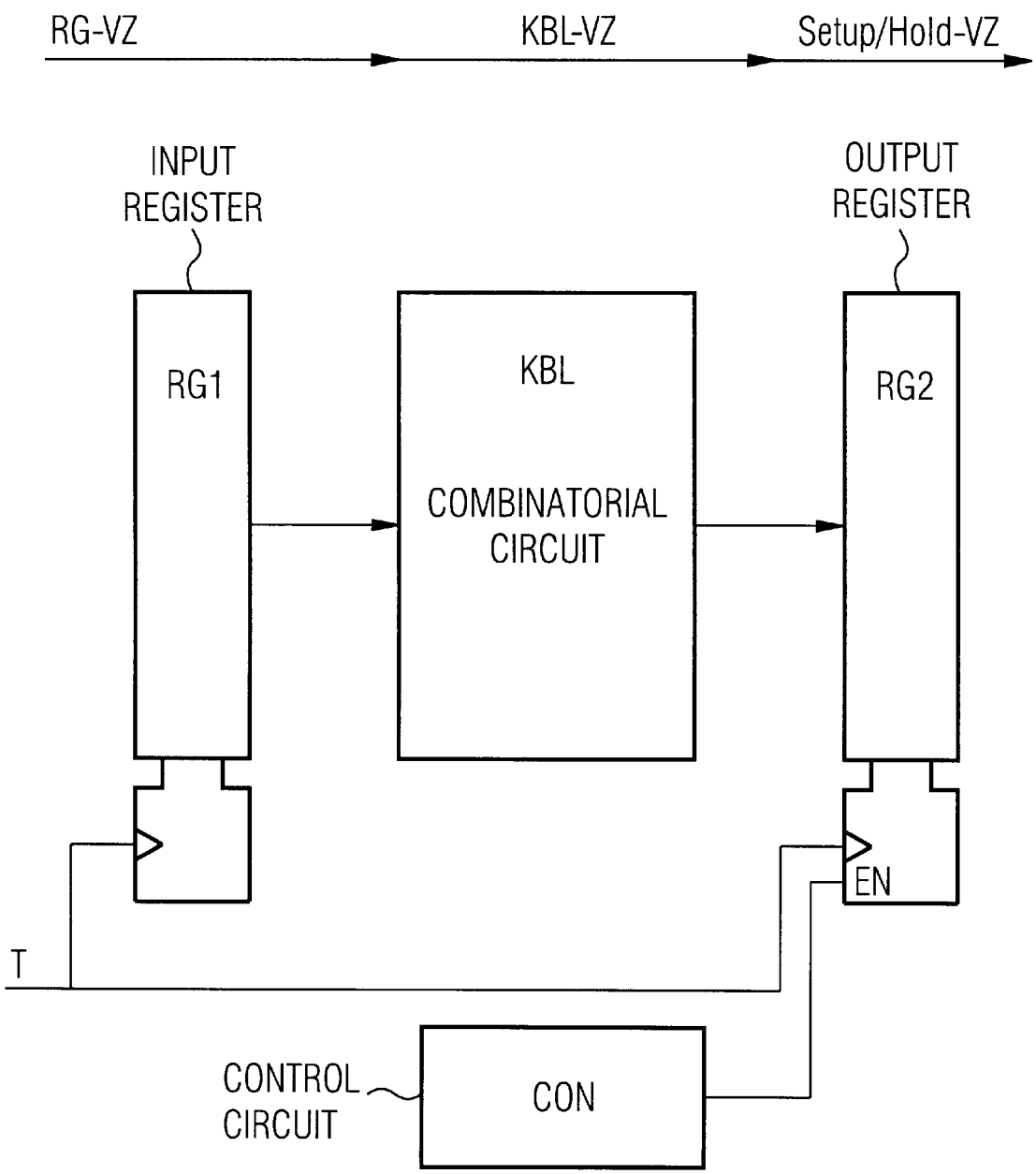
FIG. 2 is a block circuit diagram of a combinatorial circuit between registers with an additional control circuit, as known.
Figure 3:
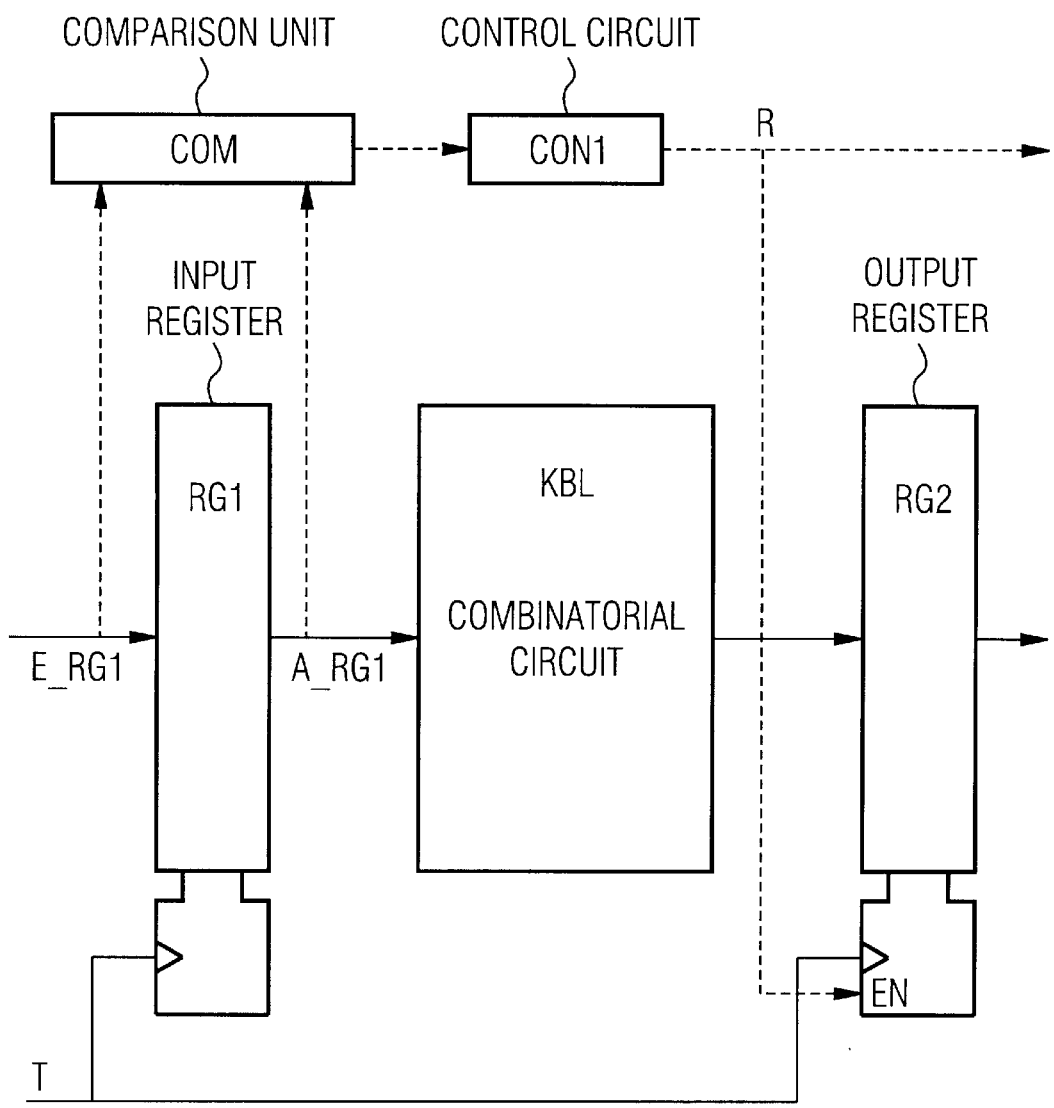
FIG. 3 is a block circuit diagram of the present invention including a comparison circuit connected at the input register.

FIG. 3 illustrates the circuit of the present invention. The input values E_RG1 and output values A_RG1 from the input register RG1 are (at least partially) compared in a comparison unit COM. It can thus be determined whether and where a signal value change occurred at the output of the input register following the next clock edge of the clock signal T. Based thereon, the control circuit CON1 generates a signal R with which the loading of the output register following the combinatorial circuit KBL is controlled dependent on signal value changes. Additionally—when necessary—the signal R from the control circuit CON1 can also be employed to specify when or after how many cycles a new value can be applied to the input register RG1.

FIG. 4 shows an applied example of the above-described invention at an adder ADD that is arranged between an input register RG1 and an output register RG2. The input register RG1 has two four-byte inputs OP1 and OP2 and one four-byte output AG. The adder ADD is constructed purely combinatorially.

The respectively least significant two bytes (called LSB and the most significant bytes (referenced MSB) of the operands OP1 and OP2 at the input and at the output of the input register RG1 are XOR-operated bit-by-bit in an XOR circuit XOR. Each output of the XOR operation is "1" when the values are different; otherwise, they are "0". An NOR operation is now implemented by an NOR circuit NOR over all outputs of the XOR operation. When an output of the XOR operation is equal to "1", i.e. an event has occurred at the lower bits, then the output is "0". In that case wherein all outputs of the XOR operation have the value "0", a "1" is adjacent at the output of the NOR operation.

This "1", first, is delayed in a circuit DFF in order to thus set the enable input EN of the output register RG2 to "1", so that the value of the output of the adder ADD can be stored in the output register RG2 with the next clock signal T. Second, this value can be output as a flag R, so that, dependent thereon, the value at the input of the input register RG1 can be held for another clock. In this case, the value "1" will appear at the output of the NOR operation one clock cycle later and the result will be clocked into the register RG2 one clock cycle later.

Although other modifications and changes may be suggested by those skilled in the art, it is the intention of the inventors to embody within the patent warranted hereon all changes and modifications as reasonably and properly come within the scope of their contribution to the art.

I claim:
1. A circuit arrangement, comprising:
   an input register and an output register each having an input and an output;
   a combinatorial block connected between said output of said input register and said input of said output register;
   a comparison unit connected to said input and said output of said input register and preceding said combinatorial block, said comparison unit comparing signal values at said input and at said output of said input register and outputting a control signal for loading an output value of said combinatorial block into said output register connected following said combinatorial block given an occurrence of a signal value change at said input of said input register.
2. A circuit arrangement according to claim 1, wherein said output register has an enable input, and further comprising:
   means for generating a clock signal; and
   a control circuit having an output connected to said enable input and operable to generate a transfer signal for said enable input of said output register from a control signal so that said output register takes in a value of an output of said combinatorial block with the next clock signal given equality of the value at said input and at said output of said input register.
3. A circuit arrangement according to claim 2, wherein said combinatorial block is implemented as adders, and wherein less significant bytes of operands supplied to said input register and less significant bytes of stored operands output at said output of said input register are compared in said comparison unit and the control signal is generated given equality of said operands.
4. A circuit arrangement according to claim 3, wherein said comparison unit is an XOR circuit.
5. A circuit arrangement according to claim 3, wherein said control circuit is an NOR circuit.

* * * * *